United States Patent
Owen et al.

(10) Patent No.: US 10,958,362 B1
(45) Date of Patent: Mar. 23, 2021

(54) METHOD AND SYSTEM FOR DETERMINING GROUP DELAY BETWEEN PERIODIC RADIO FREQUENCY (RF) SIGNALS

(71) Applicant: Keysight Technologies, Inc., Santa Rosa, CA (US)

(72) Inventors: Andrew Michael Owen, Lake Villa, IL (US); Loren C. Betts, Rohnert Park, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/803,250

(22) Filed: Feb. 27, 2020

(51) Int. Cl.
*G01R 13/02* (2006.01)
*G01R 19/25* (2006.01)
*G01R 27/28* (2006.01)
*H04L 12/26* (2006.01)
*H04B 17/21* (2015.01)

(52) U.S. Cl.
CPC ............ *H04B 17/21* (2015.01); *G01R 13/02* (2013.01); *G01R 19/25* (2013.01)

(58) Field of Classification Search
None
See application file for complete search history.

(56) References Cited

U.S. PATENT DOCUMENTS

| | | | |
|---|---|---|---|
| 6,046,595 A * | 4/2000 | Wardle | G01R 27/28 324/615 |
| 6,940,922 B2 * | 9/2005 | Cutler | H04L 25/0212 375/224 |
| 7,158,581 B2 | 1/2007 | Weiss et al. | |
| 7,941,111 B2 * | 5/2011 | Cutler | H04W 4/00 455/133 |
| 8,174,444 B2 * | 5/2012 | Parker | G01S 5/16 342/378 |
| 8,471,766 B2 * | 6/2013 | Parker | G01S 5/16 342/378 |
| 8,977,209 B2 * | 3/2015 | Cutler | H04B 17/16 455/67.11 |
| 10,345,339 B2 * | 7/2019 | Tan | G01R 13/029 |

(Continued)

FOREIGN PATENT DOCUMENTS

WO 2004042415 A1 5/2004

OTHER PUBLICATIONS

English translation of WO2004042415A1.

*Primary Examiner* — Pablo N Tran

(57) ABSTRACT

A method of determining group delay between periodic radio frequency (RF) signals received at a narrow-band coherent receivers includes receiving a first periodic RF signal at a first coherent receiver in the frequency domain, receiving a second periodic RF signal at a second coherent receiver in the frequency domain, which is delayed with respect to the first periodic RF signal, the first and second periodic signals having the same period and carrier frequency; determining a cross-spectrum signal of the first and second periodic RF signals in the frequency domain, the cross-spectrum signal including amplitudes and phases versus frequency; calculating a slope of phase of the cross-spectrum signal at frequencies over at least a portion of a bandwidth of the cross-spectrum signal; and determining a group delay between the first and second periodic RF signals to be the slope of phase of the cross-spectrum signal.

20 Claims, 10 Drawing Sheets

(56) References Cited

U.S. PATENT DOCUMENTS

| | | | |
|---|---|---|---|
| 10,367,699 B2 * | 7/2019 | Jin ............................ | H04B 3/46 |
| 10,454,600 B2 * | 10/2019 | Leibfritz ................. | H04L 27/02 |
| 2007/0177572 A1 * | 8/2007 | Werenka ............... | H04J 3/0667 |
| | | | 370/350 |

* cited by examiner

METHOD AND SYSTEM FOR DETERMINING GROUP DELAY BETWEEN PERIODIC RADIO FREQUENCY (RF) SIGNALS

BACKGROUND

Measurement instruments often require multiple ports and corresponding paths for receiving periodic radio frequency (RF) signals from a device under test (DUT) and/or other signal source. To achieve the desired measurement accuracy at the measurement plane of a measurement instrument, a system level calibration is performed in order to correct systematic amplitude, phase and time errors.

Time error correction, in particular, corrects for delays in the measurement instrument, the DUT and/or other signal sources, such that pulses of the periodic RF signals arrive at a known time from each port, where time error correction is the equivalent of relative envelope delay. Notably, time delays of sinusoidal components at different frequencies of a periodic RF signal may not be the same due to dispersion through the transmission medium. Therefore, the relative timing of multiple signals may not be determined, particularly for measurement instruments not operating in the time domain.

Conventionally, an oscilloscope operating in the time domain is used to compare timing of multiple signals through different port paths. For example, a first path receives periodic RF signals through a first port (channel 1) and a second path receives periodic RF signals through a second port (channel 2) of the oscilloscope. The relative delay between the periodic RF signals received at the different ports is computed by comparing the time delay of each pulse envelope of the periodic RF signals on each of the first and second paths of the oscilloscope.

However, use of an oscilloscope for calibration is inefficient. For some users, the oscilloscope is only used to calibrate the time errors, while other measurement instruments, such as vector network analyzers (VNAs), are used for more extensive testing. Oscilloscope measurements can also take a considerable amount of time compared to other measurement techniques, and are expensive compared to other measurement instruments, such as VNAs. Also, the measurement reference plane of an oscilloscope is often modified using adapters. Further, current state-of-the-art oscilloscopes are scalable to only four ports. Often, the measurement instruments being calibrated have more than four ports requiring the connectors/cables to be moved from one set of four ports to another set of four ports until all the ports have been measured. This incurs measurement errors due to connector/cable repeatability. In comparison, VNAs generally have an integrated calibration capability superior to that of oscilloscopes, for example, to compensate for external connectors, cables and adapters.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
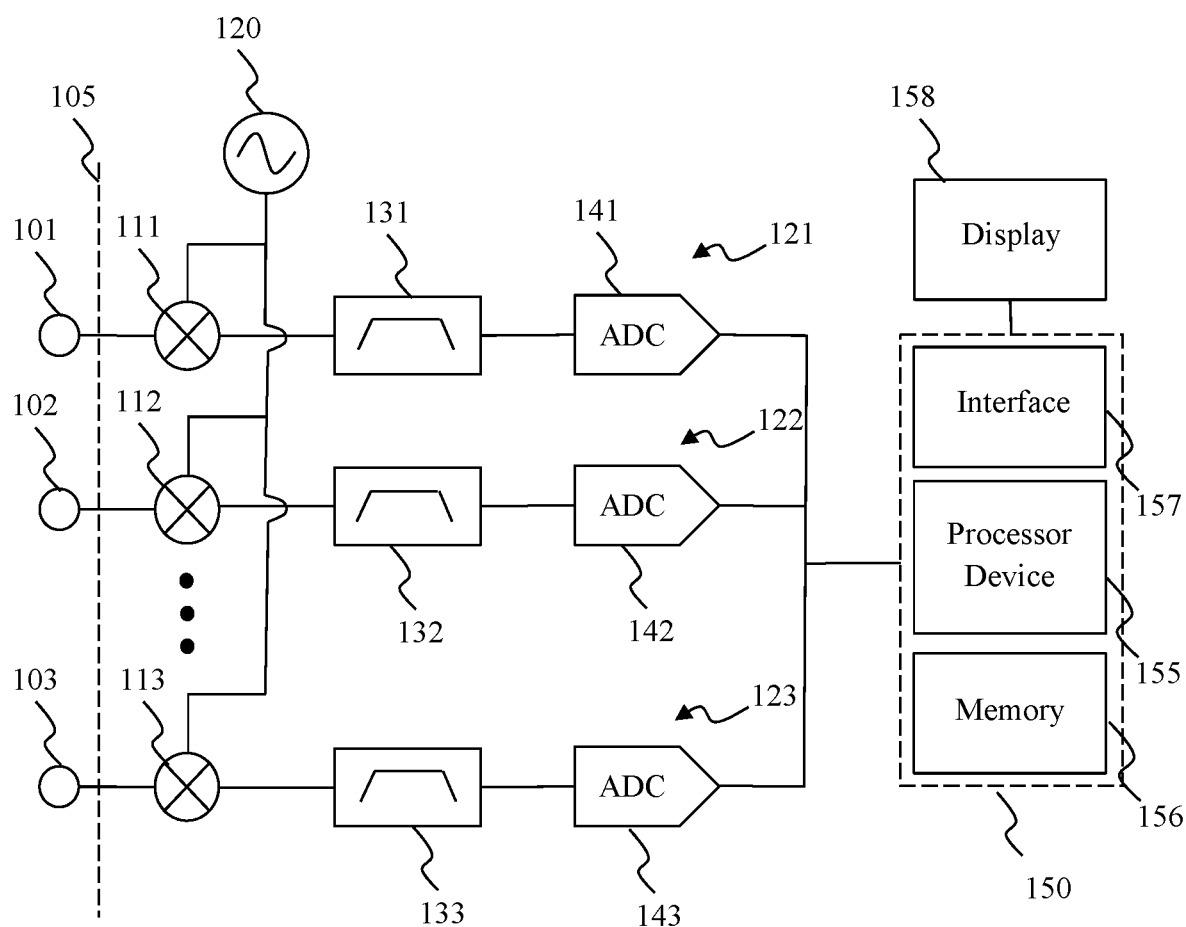
FIG. 1 is a simplified block diagram showing a system for determining time corrections between periodic RF signals in the frequency domain, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to,", "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Various embodiments are directed to methods and systems for method of determining group delay (envelope delay) between periodic radio frequency (RF) signals received at separate narrow-band coherent receivers of a measurement instrument. The group delay is determined in the frequency domain, thereby enabling use of a frequency domain measurement instrument, such as a vector network analyzer (VNA), for example, and increasing efficiency of the group delay determination by eliminated the need for receiving and processing the periodic RF signals in the time domain. Once the group delay is determined, steps may be taken to adjust the timing of one or more of the periodic RF signals in order to time synchronize them or otherwise calibrate the measurement instrument, all while receiving and processing the periodic RF signals only in the frequency domain.

FIG. 1 is a simplified block diagram showing a system for determining time corrections between periodic RF signals in the frequency domain, according to a representative embodiment.

Referring to FIG. 1, a system 100 includes narrow band coherent receivers configured to measure periodic RF signals, where a total bandwidth of each of the periodic RF signals may be wider than the available bandwidth of each coherent receiver. The periodic RF signals are multi-tone signals, where the tones (spectral lines) are indicated by sinusoidal signals at corresponding tone frequencies in the frequency domain. The system 100 may be implemented using a vector network analyzer (VNA) or a spectrum analyzer, for example, although other types of measurement instruments having coherent receivers capable of measuring signals in the frequency domain may be included, without departing from the scope of the present teachings. Due to its narrow-band nature, VNAs are very sensitive, enabling accurate measurements of the periodic RF signals even at very low signal amplitudes, which is an advantage over an oscilloscope, for example. In order to measure a periodic RF signal over its total bandwidth in the frequency domain, the system 100 may individually measure the sinusoidal signals of the periodic RF signal.

The system 100 includes multiple ports for receiving the periodic RF signals, indicated by representative first port 101, second port 102 and $m^{th}$ port 103, at measurement plane 105, where m is a positive integer indicating the total number of ports of the system 100. Each of the first port 101, the second port 102 and the $m^{th}$ port 103 has a corresponding signal path with an associated delay, such that periodic RF signals received the first port 101, the second port 102 and the $m^{th}$ port 103 will experience different delays, including group delay and phase delay. In addition, the sources of the RF signals may be connected by various lines and connectors at different physical distances from the first, second and $m^{th}$ ports 101, 102 and 103, also resulting in different delays.

In the depicted embodiment, the first port 101 is connected to a first coherent receiver 121, the second port 102 is connected to a second coherent receiver 122, and the $m^{th}$ port 103 is connected to an $m^{th}$ coherent receiver 123. The system 100 further includes a local oscillator (LO) 120 for generating LO signals at different LO frequencies applied to each of the first, second and $m^{th}$ coherent receivers 121, 122 and 123, where the LO signals are mixed with the periodic RF signals to provide corresponding intermediate frequency (IF) signals. The first coherent receiver 121 includes a first mixer 111 for mixing a first periodic RF signal received at the first port 101 and the LO signal from the LO 120 to output a first IF signal ($y_{IFp1}(t)$). The first coherent receiver 121 further includes a first narrowband filter 131 for bandpass filtering the first IF signal from the first mixer 111 in order to reject all sinusoidal signals (tones) other than the sinusoidal signal being measured by the particular acquisition, and a first analog to digital converter (ADC) 141 for digitizing the filtered first IF signal. The second coherent receiver 122 includes a second mixer 112 for mixing a second periodic RF signal received at the second port 102 and the LO signal to output a second IF signal ($y_{IFp2}(t)$), a second narrowband filter 132 for bandpass filtering the second IF signal, and a second ADC 142 for digitizing the filtered second IF signal. Likewise, the $m^{th}$ coherent receiver 123 includes an $m^{th}$ mixer 113 for mixing an $m^{th}$ periodic RF signal received at the $m^{th}$ port 103 and the LO signal to output an $m^{th}$ IF signal ($y_{IFpm}(t)$), an $m^{th}$ narrowband filter 133 for bandpass filtering the $m^{th}$ IF signal, and an $m^{th}$ ADC 143 for digitizing the filtered $m^{th}$ IF signal.

The first, second and $m^{th}$ IF signals may have the same frequency. That is, the first, second and $m^{th}$ periodic RF signals are mapped to a fixed IF for processing. In an embodiment, the system 100 may have multiple LOs 120 corresponding to the first through $m^{th}$ mixers 111, 112 and 113 for applying LO signals with known phases to the first through $m^{th}$ mixers 111, 112 and 113, respectively. Having multiple LOs enables the ability to have different frequencies for each measurement port.

As mentioned above, each periodic RF signal includes multiple tones with equal spacing, and thus is defined by a center frequency, a tone spacing and a number of tones. The tone spacing defines the length of the signal waveform, which is the reciprocal of the tone spacing for orthogonal signals. The tones may be indicated by sinusoidal signals in the frequency domain that are separated by the reciprocal of a pulse repetition interval (PRI) of the periodic RF signal. In order to receive the multiple tones of the periodic RF signal, the LO 120 is set such that each of the sinusoidal signals is down-converted to an IF signal during an acquisition, where the LO frequency of the LO 120 is stepped at each acquisition until all of the sinusoidal signals of the periodic RF signal over the total bandwidth are acquired. So, for example, for a periodic RF signal that has two tones, there will be two corresponding sinusoid signals ($\omega_{RF1}$ and $\omega_{RF2}$), having a frequency spacing that is much less than the RF carrier frequency of the periodic RF signal (i.e., $\Delta\omega \ll \omega_c$), which are acquired using two LO signals with different frequencies.

The digitized signals are provided to a processing unit 150 for additional processing and display, including for example, determining cross-spectrum signals of multiple periodic RF signals in the frequency domain, calculating a slope of phase of the cross-spectrum signal over a predetermined frequency range of the periodic RF signals, and determining a group delay between the periodic RF signals based on the slope of phase of the cross-spectrum signal, as discussed below in detail.

When the tones of the periodic RF signals are different, combination or comparison of the different periodic RF signals will lead to distortion. Accordingly, the group delay should be determined and compensated for in the system 100.

The processing unit 150 includes a processor device 155, memory 156, and an interface 157, for example, and interface with a display 158. The processor device 155, together with the memory 156, implements the methods of determining group delay between periodic RF signals received at separate ports (e.g., first and second ports 101 and 102) of the system 100, and may be configured to perform and/or control all or a portion of the steps of the processes shown in FIGS. 2, 5, 7 and 9, discussed below. In various embodiments, the processor device 155 may include one or more computer processors, digital signal processors (DSP), field-programmable gate arrays (FPGAs), application specific integrated circuits (ASICs), or combinations thereof, using any combination of hardware, software, firmware, hard-wired logic circuits, or combinations thereof. The processor device 155 may include its own processing memory (e.g., memory 156) for storing computer readable code (e.g., software, software modules) that enables performance of the various functions described herein. For example, the memory 156 may store software instructions/computer readable code executable by the processor device 155 (e.g., computer processor) for performing some or all aspects of methods described herein.

References to the processor device 155 may be interpreted to include one or more processing cores, as in a multi-core processor. The processor device 155 may also refer to a collection of processors within a single computer system or distributed among multiple computer systems, as well as a collection or network of computing devices each including a processor or processors. Programs have software instructions performed by one or multiple processors that may be within the same computing device or which may be distributed across multiple computing devices.

The processing memory, as well as other memories and databases, are collectively represented by the memory 156, and may be random-access memory (RAM), read-only memory (ROM), flash memory, electrically programmable read-only memory (EPROM), electrically erasable and programmable read only memory (EEPROM), registers, a hard disk, a removable disk, tape, compact disk read only memory (CD-ROM), digital versatile disk (DVD), registers, a hard disk, a removable disk, tape, floppy disk, blu-ray disk, or universal serial bus (USB) driver, or any other form of storage medium known in the art, which are tangible and non-transitory storage media (e.g., as compared to transitory propagating signals). Memories may be volatile or non-volatile, secure and/or encrypted, unsecure and/or unencrypted, without departing from the scope of the present teachings. As mentioned above, the memory 156 is representative of one or more memories and databases, including the processing memory, as well as multiple memories and databases, including distributed and networked memories and databases.

The interface 157 may include a user interface and/or a network interface for providing information and data output by the processor device 155 and/or the memory 156 to the user and/or for receiving information and data input by the user. That is, the interface 157 enables the user to enter data and to control or manipulate aspects of the process of measuring periodic RF signals in the frequency domain, and also enables the processor device 155 to indicate the effects of the user's control or manipulation. The interface 157 may include one or more of ports, disk drives, wireless antennas, or other types of receiver circuitry. The interface 157 may further connect one or more user interfaces, such as a mouse, a keyboard, a mouse, a trackball, a joystick, a microphone, a video camera, a touchpad, a touchscreen, voice or gesture recognition captured by a microphone or video camera, for example.

The display 158 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 158 and/or the processor device 155 may include one or more display interface(s), in which case the display 158 may provide a graphical user interface (GUI) for displaying and receiving information to and from a user.

Figure 2:
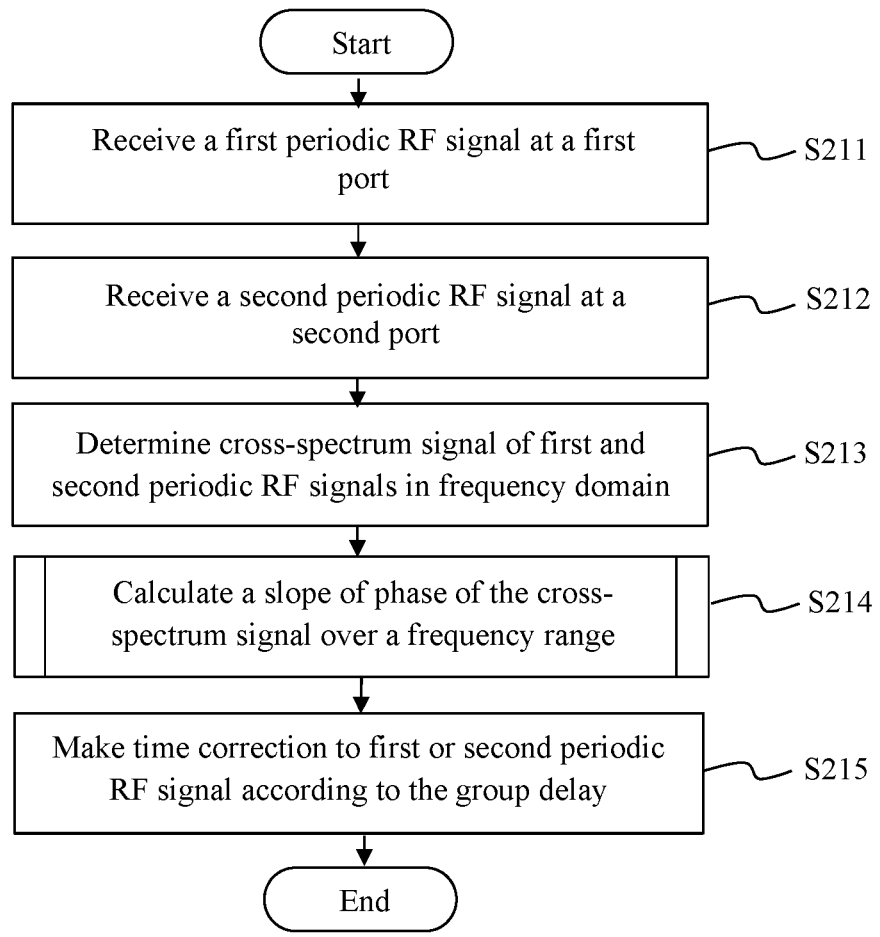
FIG. 2 is a simplified flow diagram showing a process for determining time corrections between periodic RF signals in the frequency domain, according to a representative embodiment.

FIG. 2 is a simplified flow diagram showing a process for determining time corrections between periodic RF signals in the frequency domain, according to a representative embodiment. The process may be implemented, for example, by the system 100, discussed above, such as a VNA or similarly configured measurement instrument.

Referring to FIG. 2, a first periodic RF signal is received at a first port of a first coherent receiver in block S211, and a second periodic RF signal is received at a second port of a second coherent receiver block S212. The first and second periodic RF signals have the same carrier frequency and the same period (spacing between tones or PRI), although the bandwidths may be the same or different. For example, the first and second periodic RF signals may be independently synthesized by separate signal sources, such as one or more arbitrary waveform generators (AWGs), for comparison.

Figure 3:
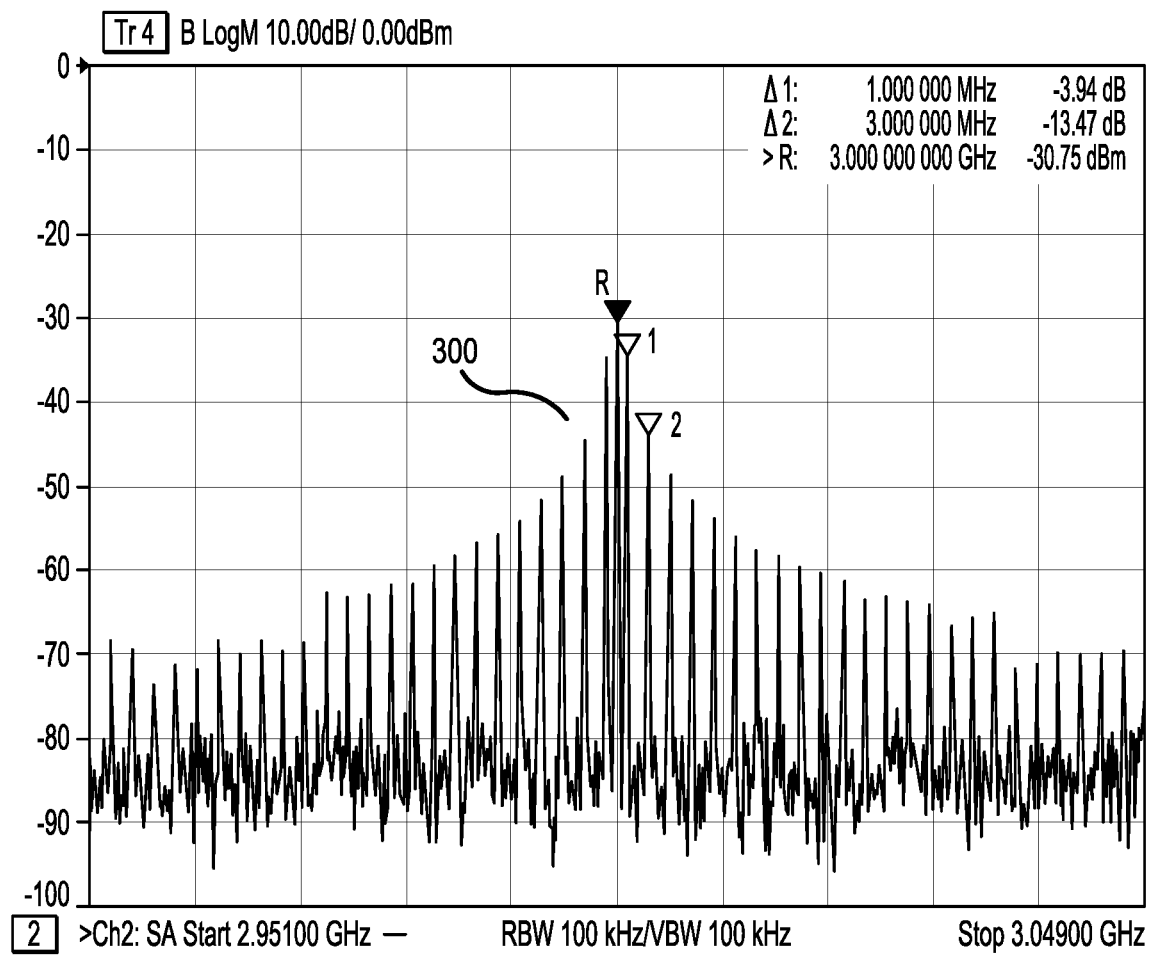
FIG. 3 is a screenshot of an illustrative periodic RF signal in the frequency domain, which may be used as the first and second periodic RF signals, according to a representative embodiment.

FIG. 3 is a screenshot of an illustrative periodic RF signal in the frequency domain, which may be used as the first and second periodic RF signals, according to a representative embodiment. Referring to FIG. 3, periodic RF signal 300 has a carrier frequency of 3 GHz, a pulse repetition frequency (PRF) of 1 MHz, and a bandwidth of 98 MHz. Spectral lines corresponding to frequencies of the multiple tones of the periodic RF signal 300 are at ±n*PRF. Accordingly, with reference to the 3 GHz carrier frequency, spectral lines appear at ±1 MHz (3.001 GHz, 2.999 GHz), ±2 MHz (3.002 GHz, 2.998 GHz), ±3 MHz (3.003 GHz, 2.997 GHz), etc., across the 98 MHz bandwidth. Generally, the various embodiments may measure any values of n as needed. For example, when even numbered tones are zero or have negligible amplitudes, the multiple tones of the periodic RF signal 300 of interest are at ±(2n−1)*PRF. For purposes of illustration, marker R is positioned at the carrier frequency of 3 GHz (amplitude of −30.75 dBm), marker 1 is positioned at a first spectral line of 3.003 GHz above the carrier frequency (amplitude of −3.94 dB), and marker 2 is positioned at a second spectral line of 3.005 GHz above the carrier frequency (amplitude of −13.47 dB).

In block S213, a cross-spectrum signal of the first and second periodic RF signals is determined in the frequency domain, where the cross-spectrum signal includes amplitudes and phases versus frequency. Measuring the cross-spectrum signal includes multiplying a complex conjugate of one of the first periodic RF signal or the second periodic signal by the other of the second periodic RF signal or the first periodic RF signal, respectively. The cross-spectrum signal may be determined one tone at a time. For example, assuming that, after down-conversion to IF signals, the first periodic RF signal at each tone n is $Y_{IFp1}(f_n)$ and the second periodic RF signal at each corresponding tone n is $Y_{IFp2}(f_n)$ in the frequency domain (as compared to $y_{IFp1}(t)$ and $y_{IFp2}(t)$ in the time domain, as mentioned above), the cross-spectrum signal $\hat{Y}(f_n)$ for the tone n may be determined according to Equation (1), where $Y_{IFp1}(f_n)^*$ indicates the complex conjugate of the first periodic RF signal:

$$\hat{Y}(f_n) = (Y_{IFp1}(f_n)^*)(Y_{IFp2}(f_n)) \qquad \text{Equation (1)}$$

Since the cross-spectrum signal $\hat{Y}(f_n)$ is determined separately for each tone in the first and second periodic RF signals, the IF of the measurement instrument need only be wide enough to capture one tone at a time, as opposed to having to be wide enough to capture the entire first and second periodic RF signals. Most VNAs, for example, would not have IFs wide enough to capture the entire first or second periodic RF signal at one time. By determining the cross-spectrum signal $\hat{Y}(f_n)$ separately for each tone, the cross-spectrum signal $\hat{Y}(f_n)$ is essentially stitched together one frequency at a time using multiple acquisitions. Of course, to the extent that certain values of n correspond to tones having no or negligible amplitude (e.g., even numbered tones), as mentioned above, Equation (1) may be performed for only those values of n corresponding to the tones with associated power (e.g., odd numbered tones).

Figure 4:
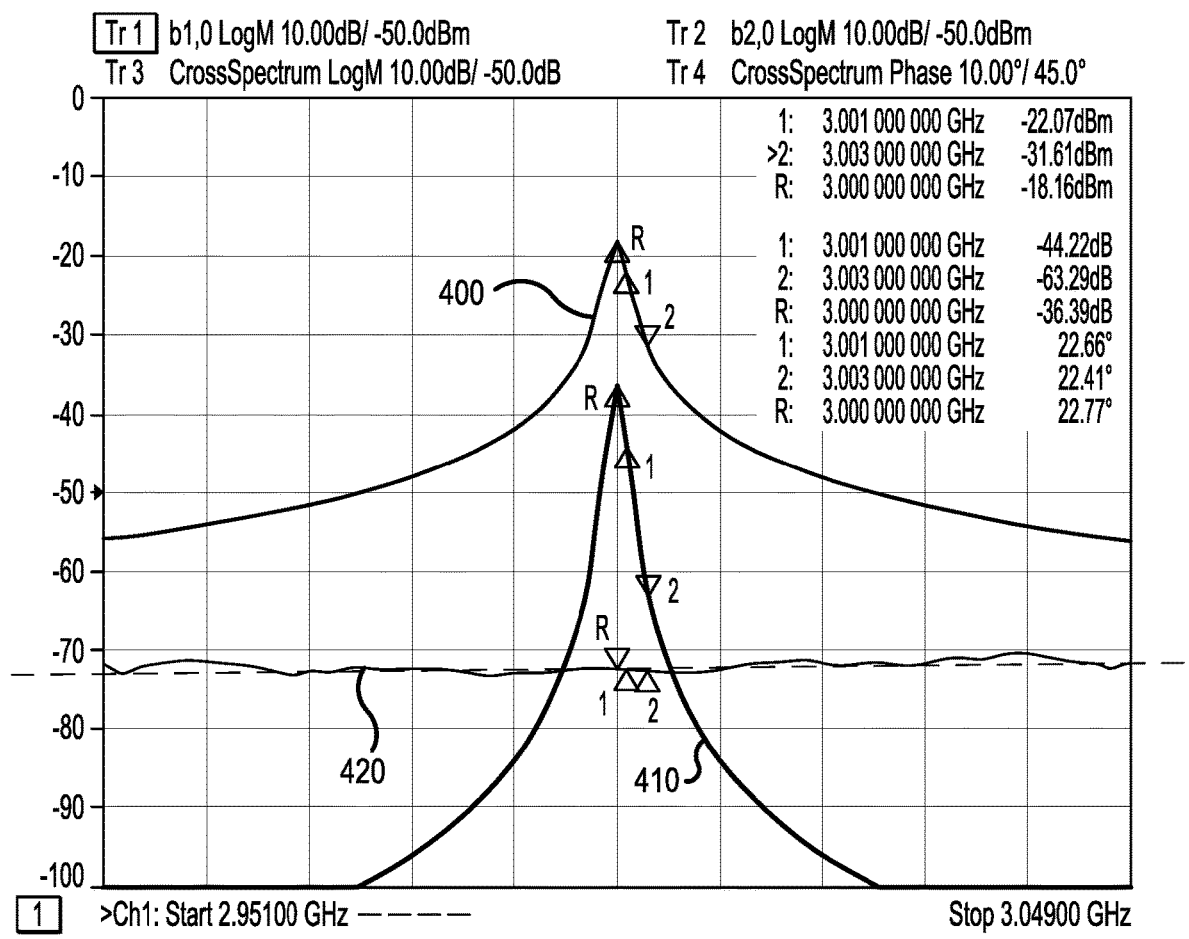
FIG. 4 is a screenshot of an illustrative cross-spectrum signal in the frequency domain, determined using the first and second periodic RF signals, according to a representative embodiment.

FIG. 4 is a screenshot of an illustrative cross-spectrum signal in the frequency domain, determined using the first and second periodic RF signals in Equation (1), according to a representative embodiment. Referring to FIG. 4, a cross-spectrum signal 400 has a center frequency of 3 GHz, corresponding to the center frequency of each of the first and second periodic RF signals. Amplitude curve 410 shows amplitude of the cross-spectrum signal 400, and phase curve 420 shows phase of the cross-spectrum signal at frequencies corresponding to the spectral lines. For purposes of illustration, marker R on the cross-spectrum signal 400 is positioned at the center frequency of 3 GHz showing an amplitude of −18.16 dBm. Also, marker 1 is positioned at a first spectral line of 3.003 GHz above the carrier frequency showing an amplitude of −22.07 dBm, and marker 2 is positioned at a second spectral line of 3.005 GHz above the carrier frequency showing an amplitude of −31.61 dBm, where marker 1 and marker 2 indicate the tone spacing of 2 MHz. With respect to the amplitude curve 410, marker R is positioned at the center frequency of 3 GHz showing an amplitude of −36.39 dB, marker 1 is positioned at the first spectral line of 3.003 GHz above the carrier frequency showing an amplitude of −44.22 dB, and marker 2 is positioned at the second spectral line of 3.005 GHz above the carrier frequency showing an amplitude of −31.61 dB. Also, with respect to the phase curve 420, marker R is positioned at the center frequency of 3 GHz showing a phase of 22.77°, marker 1 is positioned at the first spectral line of 3.003 GHz above the carrier frequency showing a phase of 22.66°, and marker 2 is positioned at the second spectral line of 3.005 GHz above the carrier frequency showing a phase of 22.41°. It is understood that the amplitude and phase values are intended to be illustrative, and are in no way limiting to the disclosure.

A slope of phase of the cross-spectrum signal is calculated according to a process indicated by block S214. The slope of the phase is determined over a predetermined frequency range that encompasses all or a portion of the bandwidth, e.g., of the system 100. Referring to the example shown in FIG. 4, the slope of the phase of the cross-spectrum signal may be determined by determining the slope of at least a portion of the phase curve 420 between an upper frequency and a lower frequency of the cross-spectrum signal within at least a portion of the bandwidth. That is, the upper and lower frequencies may correspond to the upper and lower limits of the bandwidth, or the upper and lower frequencies may be any two frequencies within the bandwidth. In various embodiments, the slope of the phase may be determined using two points on the phase curve 420 corresponding to the upper frequency and the lower frequency, where the slope is the difference between the two phase values at the upper and lower frequencies, as discussed below with reference to FIGS. 5 and 6. Alternatively, the slope of the phase may be determined using more than two points on the phase curve 420 between the upper and lower frequencies, where the slope is the slope of a line determined to be the best fit or weighted best fit to the phase data of the more than two points, as discussed below with reference to FIGS. 7 to 10.

The group delay between the first and second periodic RF signals is determined to be the slope of the phase of the cross-spectrum signal. That is, the group delay is provided by Equation (2):

$$\tau_g = -\frac{d\psi(\omega)}{d\omega} \sim -\frac{\Delta\psi(\omega)}{\Delta\omega} \qquad \text{Equation (2)}$$

In Equation (2), the expression $$\frac{\Delta\psi(\omega)}{\Delta\omega}$$

is the slope of the phase, so the group delay is essentially the negative of the slope of the phase calculated according to block S214. Delay ambiguity may be avoided when the group delay $\tau_g$ is less than half a period of the waveform (e.g., less then PRF/2) of the first or second periodic RF signal. Also, because the phase measurements and slope calculations are all performed in the frequency domain, the group delay $\tau_g$ may be determined without having to perform computationally expensive and time consuming inverse fast Fourier transforms (IFFT) or fast Fourier transforms (FFTs). Also, staying in the frequency domain minimizes the amount of processing required for picosecond resolution of relative delay of the first and second periodic RF signals.

In block S215, a time correction or other determination is made to one or both of the first and second periodic RF signals according to the determined group delay in order to time align the first and second periodic RF signals. The time correction may be implemented using a hardware delay mechanism, such as a delay line, or using a software delay algorithm implemented by the processing unit, for example. Or, the determined group delay may be used to estimate a difference in physical distance between a measurement interface and the respective sources of the first and second periodic RF signals.

Figure 5:
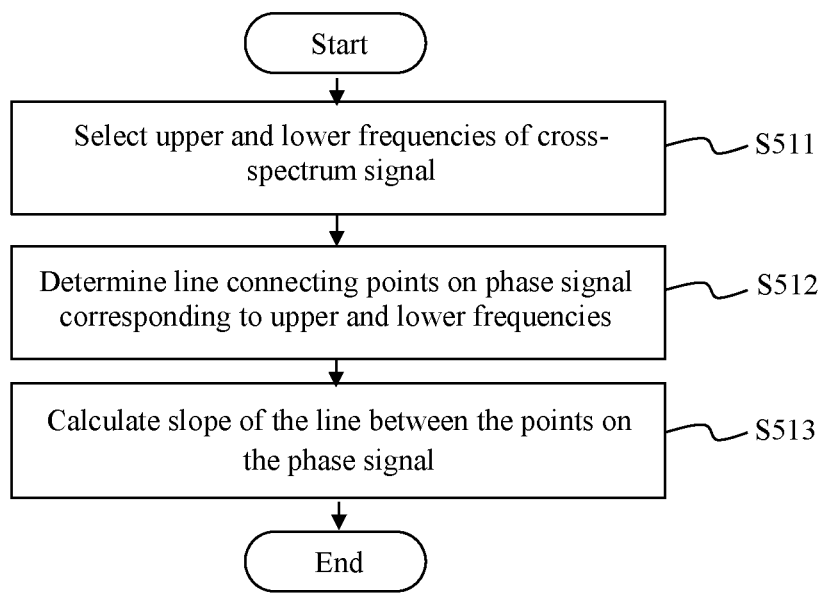
FIG. 5 is a simplified flow diagram showing a process for calculating a slope of phase of the cross-spectrum signal using two points, according to a representative embodiment.
Figure 6:
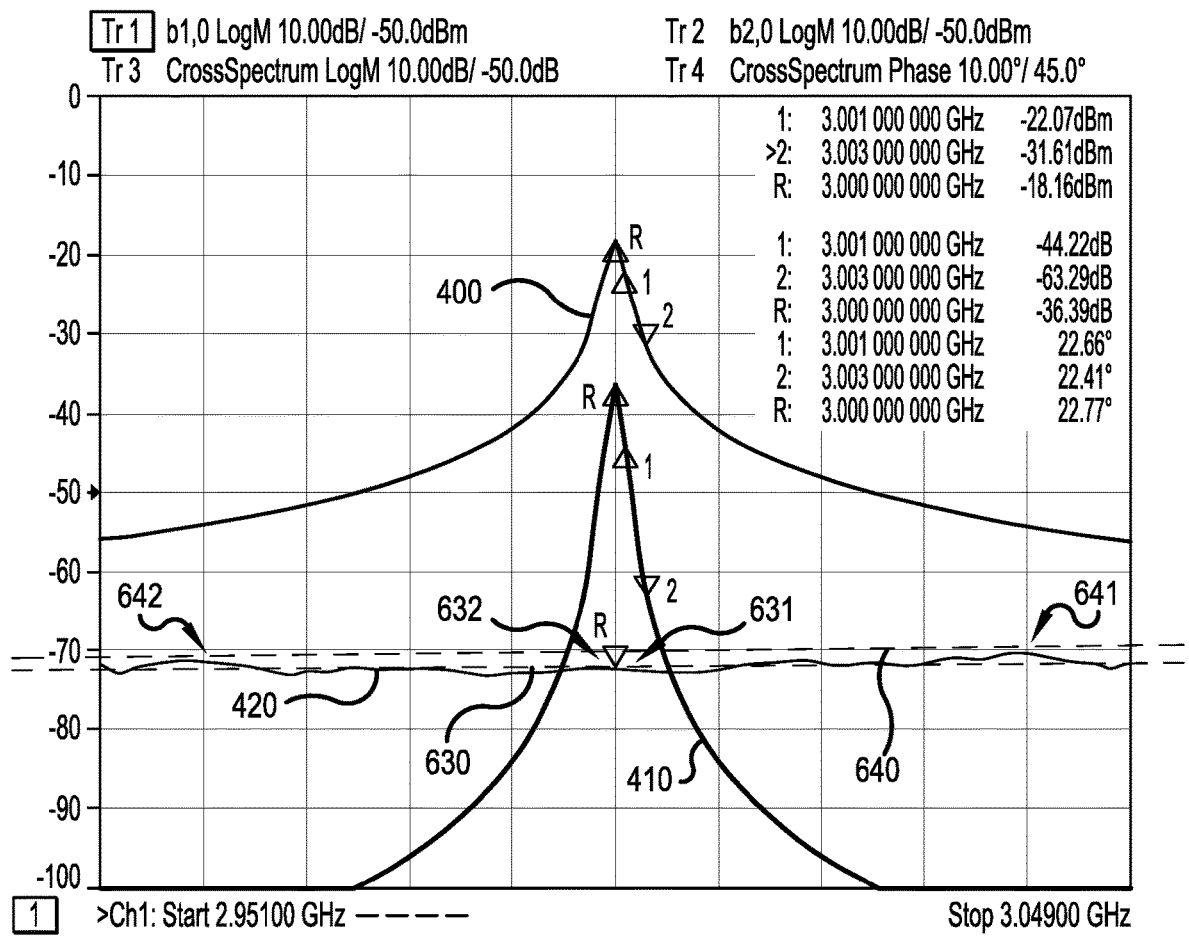
FIG. 6 is a screenshot of an illustrative phase signal of a cross-spectrum signal, and lines connecting two points corresponding to phase values of the phase signal, according to a representative embodiment.

FIG. 5 is a simplified flow diagram showing a two point process for calculating a slope of phase of the cross-spectrum signal, according to a representative embodiment, and FIG. 6 is a screenshot of an illustrative phase signal of a cross-spectrum signal, and lines connecting two points corresponding to phase values of the phase signal, according to representative embodiments.

Referring to FIG. 5, an upper frequency and a lower frequency of the cross-spectrum signal are selected in block S511. The upper and lower frequencies correspond to spectral lines in at least a portion of the bandwidth of the cross-spectrum signal. That is, the upper and lower frequencies may correspond to the upper and lower limits of the bandwidth, or the upper and lower frequencies may be any two frequencies in the bandwidth (including the upper and lower limits). The upper and lower frequencies correspond to upper and lower points on the phase curve 420 indicating respective phase values, which will be the only points used for calculating the slope of the phase. Since there are only two points, the processing involved in determining the slope of the phase is very fast.

In an embodiment, the selected upper and lower frequencies are relatively close to one another in the bandwidth of the cross-spectrum signal, as shown by upper frequency point 631 and lower frequency point 632 on the phase curve 420 in FIG. 6. Relatively close means that the upper and lower frequencies are located ±PRF from a selected spectral line, such as a spectral line at or near the center frequency of the cross-spectrum signal. When the selected spectral line is at or near the center frequency, the upper and lower frequencies may be within a portion of the cross-spectrum signal with relatively high amplitude and signal to noise ratio (SNR). For example, the upper and lower frequencies may be selected within a portion of the cross-spectrum signal with amplitude exceeding about −70 dBm, for example, or other threshold of desirable amplitude, as indicated by the amplitude curve 410. In this case, because the spectral lines corresponding to these upper and lower frequencies have high amplitudes, they account for much of the relative characteristics of the cross-spectrum signal and have high SNRs. Due to the relative closeness the upper and lower frequencies, however, the calculated slope may be less accurate with regard to the actual slope of the phase of the cross-spectrum signal across the entire phase signal.

In another embodiment, the selected upper and lower frequencies are relatively far from one another in the bandwidth of the cross-spectrum signal, as shown by upper frequency point 641 and lower frequency point 642 shown on the phase curve 420 in FIG. 6. Relatively far means that the upper and lower frequencies are located at ±nPRF from a selected spectral line, such as a spectral line at or near the center frequency of the cross-spectrum signal, where n>2. The greater separation between the upper and lower frequencies increases the ability to accurately capture the actual slope of the phase of the cross-spectrum signal. Higher values of n will tend to average out any dispersion present over the span of the measurement (e.g., $2*(2n-1)*PRF$), and thus will provide a more accurate slope that is closer to the actual delay value. However, due to the wider separation of the upper and lower frequencies, the associated amplitudes will likely be lower as compared to the amplitudes associated with the upper and lower frequencies of spectral lines that are closer to one another, as discussed above.

In block S512, a line is determined directly connecting upper and lower points on the phase signal corresponding to the selected upper and lower frequencies, respectively. For example, the upper frequency point 631 and the lower frequency point 632 are connected by dashed line 630, and the upper frequency point 641 and the lower frequency point 642 are connected by dashed line 640 in FIG. 6.

In block S513, a slope of the line is calculated between the upper and lower points on the phase signal. In particular, the slope is equal to the difference in phases indicated by the upper and lower points divided by the difference between the upper and lower frequencies. Thus, referring to FIG. 6, the slope of the dashed line 630 is determined across the selected upper and lower frequencies relatively close to one another, and the slope of the dashed line 640 is determined across the selected upper and lower frequencies being relatively far from one another. Notably, in both scenarios involving selection of two points to determine the slope of the phase, both points may be at frequencies either above or below the center frequency of the cross-spectrum signal, or one point may be at a frequency above the center frequency and the other point at a frequency below the center frequency, without departing from the scope of the present teachings.

Figure 7:
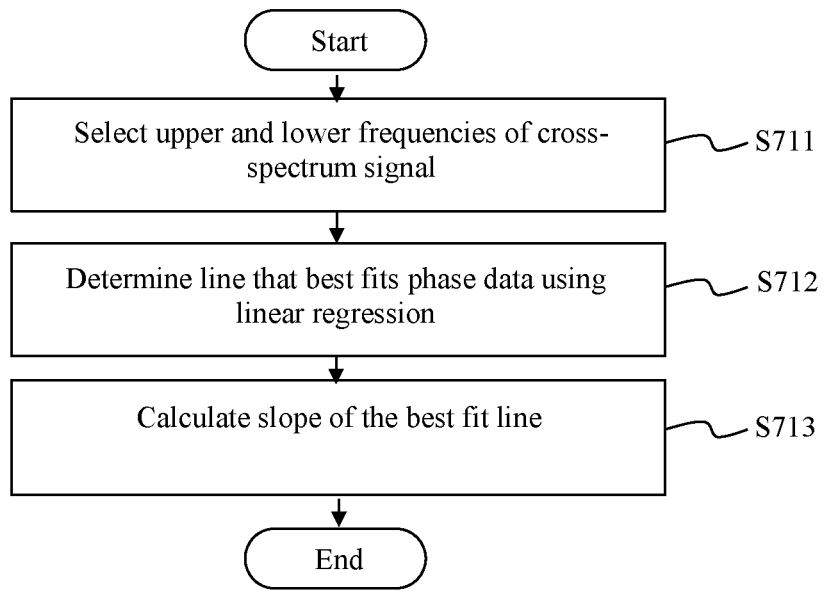
FIG. 7 is a simplified flow diagram showing a process for calculating a slope of phase of the cross-spectrum signal using a best fit line, according to a representative embodiment.
Figure 8:
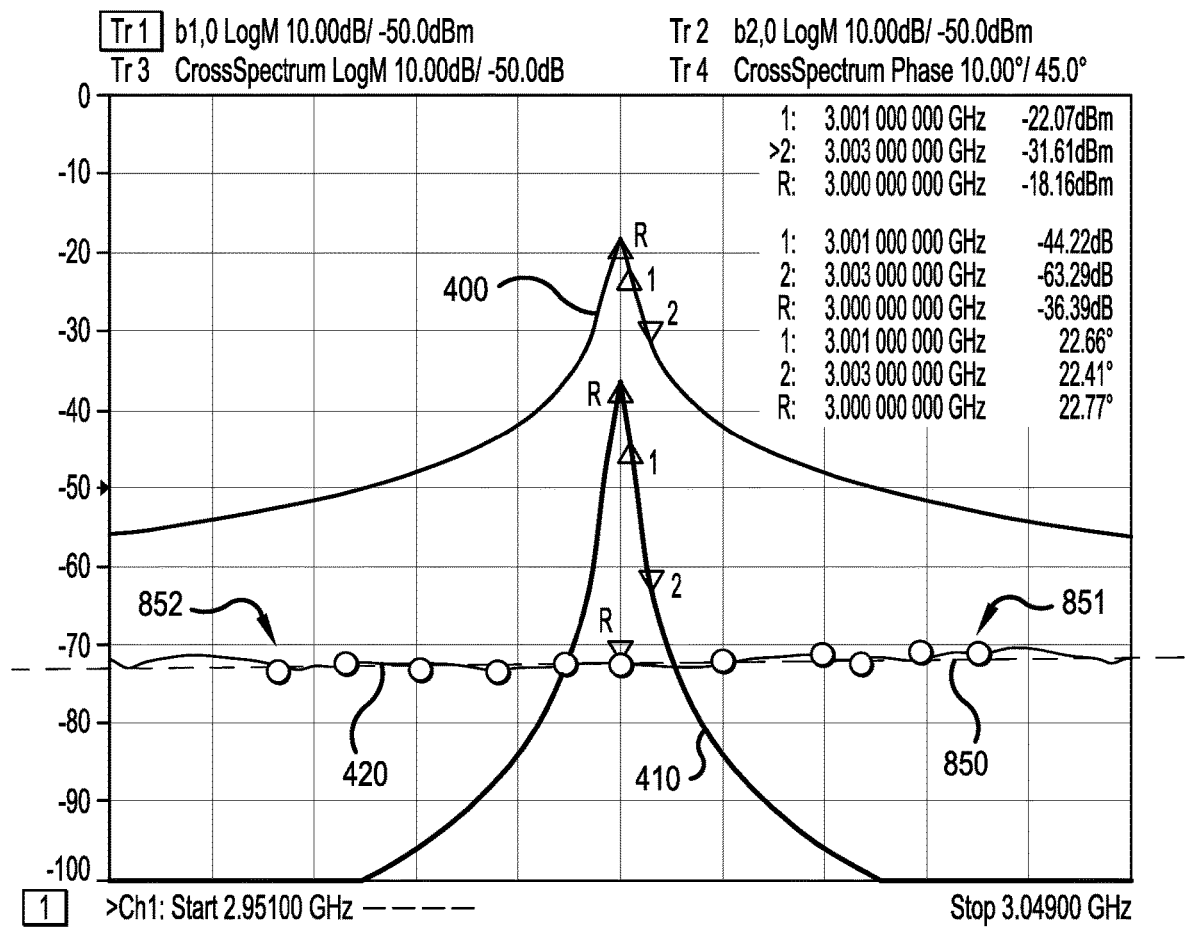
FIG. 8 is a screenshot of an illustrative phase signal of a cross-spectrum signal, and a best fit line for phase values of the phase signal, according to a representative embodiment.

FIG. 7 is a simplified flow diagram showing a process for calculating a slope of phase of the cross-spectrum signal using ordinary least squares fitting, and FIG. 8 is a screenshot of an illustrative phase signal of a cross-spectrum signal and a best fit line for phase values determined using ordinary least squares fitting, according to a representative embodiment.

Referring to FIG. 7, an upper frequency and a lower frequency of the cross-spectrum signal are selected in block S711, where the upper and lower frequencies define a frequency span of interest. The upper and lower frequencies correspond to spectral lines in at least a portion of the bandwidth of the cross-spectrum signal. That is, the upper and lower frequencies may correspond to the upper and lower limits of the bandwidth, or the upper and lower frequencies may be any two frequencies in the bandwidth (including the upper and lower limits). The upper and lower frequencies also correspond to upper and lower points of phase values on the phase curve 420.

In the present embodiment, it is desirable for the upper and lower frequencies to be spaced relatively far from one another in the bandwidth of the cross-spectrum signal, as discussed above, as shown by upper frequency point 851 and lower frequency point 852 shown on the phase curve 420 in FIG. 8. The phase curve 420 also includes multiple points of additional phase values between the upper and lower frequency points 851 and 852 (e.g., for a total of 51 points), indicated by representative dots on the phase curve 420. Of course, the number of points on the phase curve 420 is not limited to 51, and may vary without departing from the scope of the present teachings. The number of points is sufficient, though, to prevent phase ambiguity and to otherwise accurately capture the phase curve 420, as would be apparent to one skilled in the art. Generally, the more points increase robustness and repeatability in the presence of noise, but at the expense of increased measurement time. In an embodiment, the points on the phase curve 420 are located at frequencies corresponding to the PRF, e.g., every 1 MHz in the example shown in FIG. 8.

In block S712, a line is determined that best fits the phase data of the phase curve 420 using least squares fitting (i.e., linear regression), having a linear slope. The best fit line is shown in FIG. 8 as dashed line 850. The linear regression provides a line that minimizes mean-squared error of phase versus frequency at all or substantially all of the identified points of the phase curve 420 within the frequency span of interest. Application of linear regression to determine a best fit line is well known to one skilled in the art.

Because all or substantially all the identified points of the phase curve 420 over the frequency span of interest are considered, the effects of noise are averaged out. Accordingly, the linear regression provides a more accurate linear representation of the phase curve 420 than the two-point phase slope calculation processes described above with reference to FIGS. 5 and 6, although linear regression requires more computation. Also, determination of the dashed line 850 is not biased by localized dispersion (non-linear differential phase), as in the two point process that uses upper and lower frequencies that are relatively close to one another.

In block S713, a slope is calculated for the line that best fits the shape of the phase curve 420 determined in block S712 using linear regression. Referring to FIG. 8, in particular, the slope of the dashed line 850 is determined as the difference in phase over the frequency span of interest. The slope of the dashed line 850 is the group delay between the first and second periodic RF signals of the cross-spectrum signal. Notably, because phases at several points on the phase curve 420 are measured (at least more than two points), the measurement time exceeds that of the two point processes described above.

Figure 9:
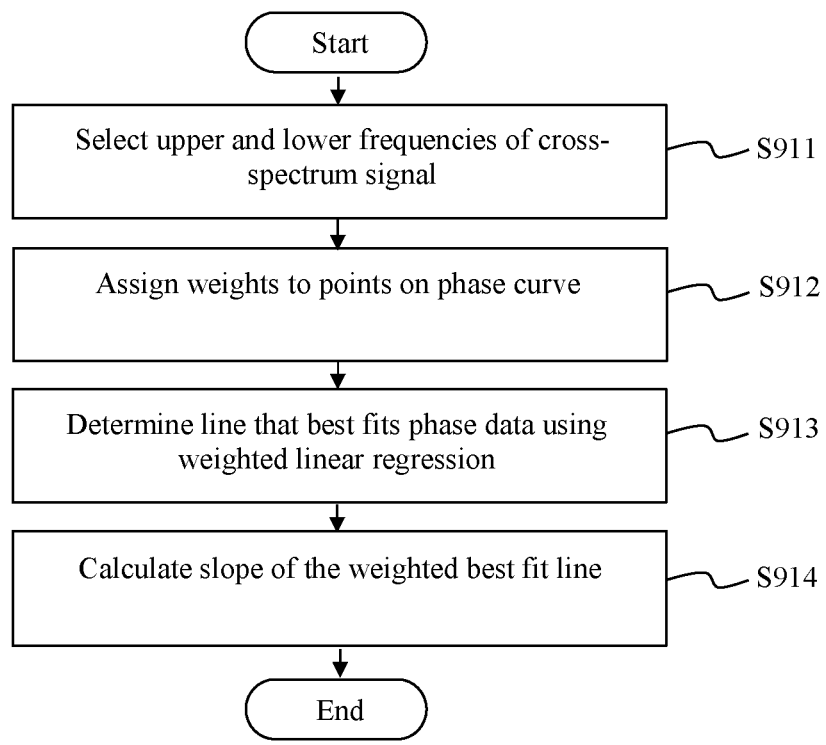
FIG. 9 is a simplified flow diagram showing a process for calculating a slope of phase of the cross-spectrum signal using a weighted best fit line, according to a representative embodiment.
Figure 10:
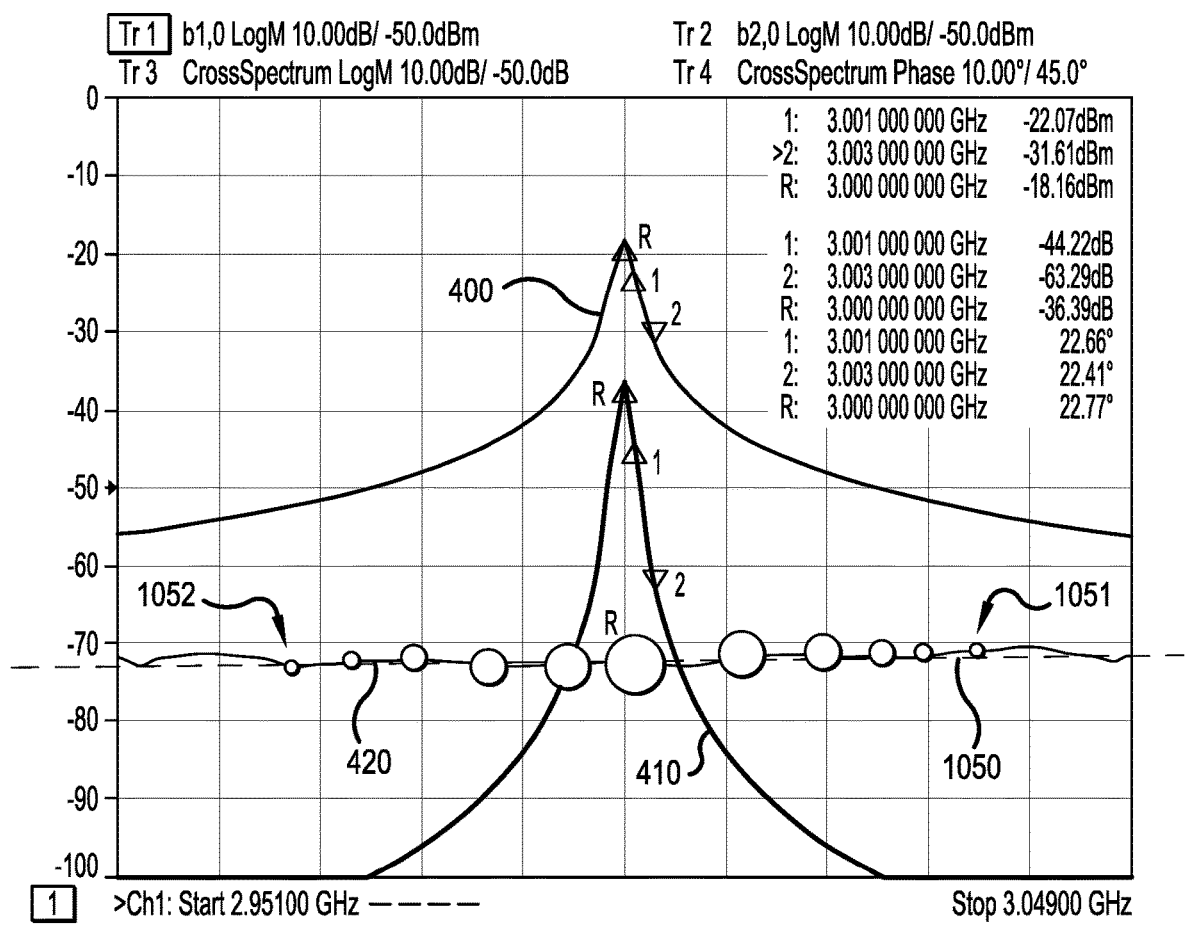
FIG. 10 is a screenshot of an illustrative phase signal of a cross-spectrum signal, and a weighted best fit line for phase values of the phase signal, according to a representative embodiment.

FIG. 9 is a simplified flow diagram showing a process for calculating a slope of phase of the cross-spectrum signal using weighted least squares fitting, and FIG. 10 is a screenshot of an illustrative phase signal of a cross-spectrum signal and a best fit line for phase values determined using weighted least squares fitting, according to a representative embodiment.

Referring to FIG. 9, an upper frequency and a lower frequency of the cross-spectrum signal are selected in block S911, where the upper and lower frequencies define a frequency span of interest. The upper and lower frequencies correspond to spectral lines in at least a portion of the bandwidth of the cross-spectrum signal. That is, the upper and lower frequencies may correspond to the upper and lower limits of the bandwidth, or the upper and lower frequencies may be any two frequencies in the bandwidth (including the upper and lower limits). The upper and lower frequencies also correspond to upper and lower points of phase values on the phase curve 420.

In the present embodiment, it is desirable for the upper and lower frequencies to be spaced relatively far from one another in the bandwidth of the cross-spectrum signal, as discussed above, as shown by upper frequency point 1051 and lower frequency point 1052 shown on the phase curve 420 in FIG. 10. The phase curve 420 also includes multiple points of additional phase values between the upper and lower frequency points 1051 and 1052 (e.g., for a total of 51 points), indicated by representative dots on the phase curve 420. Of course, the number of points on the phase curve 420 is not limited to 51, and may vary without departing from the scope of the present teachings. The number of points is sufficient, though, to prevent phase ambiguity and to otherwise accurately capture the phase curve 420, as would be apparent to one skilled in the art. In an embodiment, the points on the phase curve 420 are located at frequencies corresponding to the PRF, e.g., every 1 MHz in the example shown in FIG. 10.

In block S912, weights are assigned to the points on the phase curve 420 based on the amplitudes of the corresponding spectral lines in the cross-spectrum signal, where the amplitudes are indicated by the amplitude curve 410. Generally, the greater the amplitude of the cross-spectrum signal 400 at a particular frequency, the more weight is assigned to the phase value point on the phase curve 420 at that frequency. The points where the amplitude of the cross-spectrum signal 400 is highest are weighed more heavily because the corresponding phase data is considered more reliable, since SNR is higher and thus variance is lower. The relative weights are shown in FIG. 10 by the sizes (diameters) of the dots showing representative points on the phase curve 420, where the larger dots indicate greater weights assigned to the corresponding points. Notably, the larger dots are at frequencies nearer to the center frequency, particularly nearer to the peak of the amplitude curve 110.

In block S913, a line is determined that best fits the differently weighted phase data of the phase curve 420 using weighted least squares fitting (i.e., weighted linear regression), the line having a linear slope. The weighted best fit line is shown in FIG. 10 as dashed line 1050. The weighted linear regression provides a line that minimizes the weighted mean-squared error of phase versus frequency at all or substantially all of the identified points of the phase curve 420 within the frequency span of interest. Application of weighted linear regression to determine a best fit line is well known to one skilled in the art.

Because all or substantially all identified points of the phase curve 420 over the frequency span of interest are considered, the effects of noise are averaged out. Also, by assigning more weight to the higher amplitude phase value points, potentially less accurate phase values on the phase curve 420 will have less effect on the weighted best fit line and corresponding linear slope.

Accordingly, the weighted linear regression provides a more accurate linear representation of the phase curve 420 than the two-point phase slope calculation processes described above with reference to FIGS. 5 and 6, and than the ordinary linear regression phase slope calculation process described above with reference to FIGS. 8 and 9, although weighted linear regression requires more computation. Also, as mentioned above, determination of the dashed line 850 is not biased by localized dispersion (non-linear differential phase), as in the two point process that uses upper and lower frequencies that are relatively close to one another.

In block S914, a slope is calculated for the line providing the weighted best fit to the shape of the phase curve 420 determined in block S913. Referring to FIG. 10, in particular, the slope of the dashed line 1050 is determined as the difference in phase over the frequency span of interest. The slope of the dashed line 1050 is the group delay between the first and second periodic RF signals of the cross-spectrum signal. Notably, because phases at several points on the phase curve 420 are measured (at least more than two points) and weighted, the measurement time exceeds that of the two point processes described above, and also may exceed the measurement time of the linear regression process to a lesser degree. Generally, the weighted best fit line provides better repeatability than the ordinary best fit line described above with reference to FIGS. 7 and 8.

While the invention has been illustrated and described in detail in the drawings and foregoing description, such illustration and description are to be considered illustrative or exemplary and not restrictive; the invention is not limited to the disclosed embodiments.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of determining group delay between periodic radio frequency (RF) signals received at separate ports of a measurement instrument having at least one local oscillator (LO) and a plurality of coherent receivers corresponding to the separate ports, the method comprising:
    receiving a first periodic RF signal in a frequency domain at a first coherent receiver through a first port, the first periodic RF signal having a period and a carrier frequency;
    receiving a second periodic RF signal in the frequency domain at a second coherent receiver through a second port, which is delayed with respect to the first periodic RF signal, the second periodic RF signal having the same period and the carrier frequency of the first periodic RF signal;
    determining a cross-spectrum signal of the first and second periodic RF signals in the frequency domain, the cross-spectrum signal comprising amplitudes and phases versus frequency; and
    determining a slope of phase of the cross-spectrum signal at frequencies over at least a portion of a bandwidth of the cross-spectrum signal, wherein a group delay between the first and second periodic RF signals is a negative of the slope of phase of the cross-spectrum signal,
    wherein a total bandwidth of each of the first and second periodic RF signals is wider than an available bandwidth of the coherent receiver.

2. The method of claim 1, wherein the measurement instrument has one LO for applying an LO signal to a mixer in each of the plurality of coherent receivers.

3. The method of claim 1, wherein the measurement instrument has a plurality of LOs corresponding to the plurality of coherent receivers for applying LO signals with known phases to a plurality of mixers in the plurality of coherent receivers, respectively.

4. The method of claim 1, wherein the coherent receivers reside in a vector network analyzer (VNA).

5. The method of claim 1, further comprising:
    making a time correction to one of the first and second periodic RF signals according to the group delay in order to time align the first and second periodic RF signals.

6. The method of claim 1, further comprising:
    determining a difference in physical distance between a measurement interface of the coherent receivers and respective sources of the first and second periodic RF signals.

7. The method of claim 1, wherein determining the cross-spectrum signal comprises multiplying a complex conjugate of the first periodic RF signal or the second periodic RF signal by the second periodic RF signal or the first periodic RF signal, respectively.

8. The method of claim 1, wherein determining the slope of the phase of the cross-spectrum signal comprises:
    selecting an upper frequency and a lower frequency of the cross-spectrum signal within the at least a portion of the bandwidth; and
    calculating a slope between phases at the upper frequency and the lower frequency of the cross-spectrum signal, wherein the slope of the phase of the cross-spectrum signal is determined to be the calculated slope between the phases at the upper frequency and the lower frequency.

9. The method of claim 8, wherein the selected upper frequency is a pulse repetition frequency (PRF) above a selected spectral line in the cross-spectrum signal, and the selected lower frequency is the PRF below the selected spectral line.

10. The method of claim 8, wherein the selected upper frequency is an integer multiple of a pulse repetition frequency (PRF) above a selected spectral line in the cross-spectrum signal, and the selected lower frequency is the integer multiple of the PRF below the selected spectral line in the cross-spectrum signal, the integer multiple being greater than or equal to 2.

11. The method of claim 1, wherein determining the slope of the phase of the cross-spectrum signal comprises:
    calculating a slope of a line using linear regression that minimizes a mean-squared error of phase versus frequency at a plurality of frequencies of the cross-spectrum signal across the at least a portion of the bandwidth, wherein the slope of the phase of the cross-spectrum signal is determined to be the calculated slope of the line.

12. The method of claim 1, wherein determining the slope of the phase of the cross-spectrum signal comprises:
    assigning weights to the cross-spectrum signal at a plurality of frequencies of the cross-spectrum signal, respectively, across the at least a portion of the bandwidth; and
    calculating a slope of a line using weighted linear regression that minimizes a weighted mean-squared error of phase versus frequency at the plurality of frequencies of the cross-spectrum signal using the assigned weights, wherein the slope of the phase of the cross-spectrum signal is determined to be the calculated slope of the line.

13. The method of claim 12, wherein the weights are assigned to the plurality of frequencies based on corresponding magnitudes of the cross-spectrum signal at the plurality of frequencies, respectively.

14. A system for determining group delay between periodic radio frequency (RF) signals the system comprising:
- a local oscillator (LO) for generating LO signals;
- a first coherent receiver operating in a frequency domain for receiving a first periodic RF signal having a period and a carrier frequency through a first port, the first coherent receiver comprising:
  - a first mixer for mixing the first periodic RF signal and the LO signal to provide a first intermediate frequency (IF) signal;
  - a first analog to digital converter (ADC) for digitizing the first IF signal;
- a second coherent receiver operating in the frequency domain for receiving a second periodic RF signal having the period and the carrier frequency the first periodic RF signal through a second port, wherein the second periodic RF signal is delayed with respect to the first periodic RF signal, and wherein a total bandwidth of each of the first and second periodic RF signals is wider than an available bandwidth of the first and second coherent receivers, the second coherent receiver comprising:
  - a second mixer for mixing the second periodic RF signal and the LO signal to provide a second IF signal; and
  - a second ADC for digitizing the second IF signal; and
- a processing unit comprising a processor device and a memory for storing instructions that, when executed by the processor device, cause the processing unit to:
  - determine a cross-spectrum signal of the first and second periodic RF signals in the frequency domain using the first and second IF signals, the cross-spectrum signal comprising amplitudes and phases versus frequency; and
  - determine a slope of phase of the cross-spectrum signal at frequencies over at least a portion of a bandwidth of the cross-spectrum signal, wherein a group delay between the first and second periodic RF signals is a negative of the slope of phase of the cross-spectrum signal.

15. The system of claim 14, wherein the instructions cause the processing unit to determine the cross-spectrum signal by multiplying a complex conjugate of the first periodic RF signal or the second periodic RF signal by the second periodic RF signal or the first periodic RF signal, respectively.

16. The system of claim 14, wherein the instructions cause the processing unit to determine the slope of the phase of the cross-spectrum signal by:
- selecting an upper frequency and a lower frequency of the cross-spectrum signal within the at least a portion of the bandwidth; and
- calculating a slope between phases at the upper frequency and the lower frequency of the cross-spectrum signal, wherein the slope of the phase of the cross-spectrum signal is determined to be the calculated slope between the phases at the upper frequency and the lower frequency.

17. The system of claim 14, wherein the instructions cause the processing unit to determine the slope of the phase of the cross-spectrum signal by:
- calculating a slope of a line using linear regression that minimizes a mean-squared error of phase versus frequency at a plurality of frequencies of the cross-spectrum signal across the at least a portion of the bandwidth, wherein the slope of the phase of the cross-spectrum signal is determined to be the calculated slope of the line.

18. The system of claim 14, wherein the instructions cause the processing unit to determine the slope of the phase of the cross-spectrum signal by:
- assigning weights to the cross-spectrum signal at a plurality of frequencies of the cross-spectrum signal, respectively, across the at least a portion of the bandwidth; and
- calculating a slope of a line using weighted linear regression that minimizes a weighted mean-squared error of phase versus frequency at the plurality of frequencies of the cross-spectrum signal using the assigned weights, wherein the slope of the phase of the cross-spectrum signal is determined to be the calculated slope of the line.

19. The system of claim 18, wherein the weights are assigned to the plurality of frequencies based on corresponding magnitudes of the cross-spectrum signal at the plurality of frequencies, respectively.

20. The system of claim 14, wherein the instructions cause the processing unit to determine control a time correction to one of the first and second periodic RF signals according to the group delay in order to time align the first and second periodic RF signals.

* * * * *